United States Patent
Shroff et al.

(10) Patent No.: US 7,511,360 B2
(45) Date of Patent: Mar. 31, 2009

(54) SEMICONDUCTOR DEVICE HAVING STRESSORS AND METHOD FOR FORMING

(75) Inventors: Mehul D. Shroff, Austin, TX (US); Paul A. Grudowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 212 days.

(21) Appl. No.: 11/300,091

(22) Filed: Dec. 14, 2005

(65) Prior Publication Data
US 2007/0132031 A1 Jun. 14, 2007

(51) Int. Cl.
*H01L 29/72* (2006.01)
(52) U.S. Cl. .................. 257/632; 257/368; 257/369; 257/374; 257/401; 257/649
(58) Field of Classification Search ........... 257/368, 257/369, 374, 401, 632, 649
See application file for complete search history.

(56) References Cited

U.S. PATENT DOCUMENTS

| 5,591,494 A | 1/1997 | Sato et al. |
|---|---|---|
| 5,707,486 A | 1/1998 | Collins |
| 6,870,179 B2 | 3/2005 | Shaheed et al. |
| 6,876,081 B2 | 4/2005 | Chow |
| 2004/0029323 A1 | 2/2004 | Shimizu et al. |
| 2007/0082439 A1* | 4/2007 | Park et al. ............ 438/231 |

OTHER PUBLICATIONS

PCT/US06/60638 International Search Report and Written Opinion.

* cited by examiner

*Primary Examiner*—Edward Wojciechowicz
(74) *Attorney, Agent, or Firm*—Joanna G. Chiu; James L. Clingan, Jr.

(57) ABSTRACT

N channel and P channel transistors are enhanced by applying stressor layers of tensile and compressive, respectively, over them. A previously unknown problem was discovered concerning the two stressor layers, which both may conveniently be nitride but made somewhat differently. The two stressors have different etch rates which results in deleterious effects when etching a contact hole at the interface between the two stressors. A contact to a gate is often preferably half way between N and P channel transistors which is also the seemingly best location for the border between the two stressor layers. The contact etch at the border can result in pitting of the underlying gate structure or in residual nitride in the contact hole. Therefore, it has been found beneficial to ensure that each contact is at least some predetermined distance from the stressor of the opposite type from the one the contact is passing through.

12 Claims, 9 Drawing Sheets

SEMICONDUCTOR DEVICE HAVING STRESSORS AND METHOD FOR FORMING

FIELD OF THE INVENTION

This invention relates generally to semiconductor processing, and more specifically, to semiconductor devices having compressive and tensile stressors.

RELATED ART

As technology advances, semiconductor devices and integrated circuits are continually being scaled down in size. However, in some cases, physical limits of scaling are being reached leading to difficulty in device scaling. Therefore, as technology advances, other ways of obtaining improved performance of semiconductor devices are being used. For example, the channels of transistors may be stressed in order to improve carrier mobility and improve performance. For example, for P channel transistors, a uniaxial compressive stressed channel allows for improved carrier mobility while for N channel transistors, a uniaxial tensile stressed channel allows for improved carrier mobility. Therefore, in order to achieve improved overall performance, it is desirable to utilize both tensile and compressive contact etch stop layer (ESL) stressors on a same integrated circuit in order to improve the performance of both P channel and N channel devices.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In order to improve the performance of both P channel and N channel devices, stressors may be used in order to stress the channels of the device. For example, in an integrated circuit, compressive stressors may be formed over the P channel transistors and tensile stressors may be formed over the N channel transistors. In this manner, the channels of the P channel transistors will be compressively stressed and the channels of the N channel transistors will be tensilely stressed, both in the direction of the current flow, thus improving carrier mobility and device performance for both P channel and N channel transistors. These compressive and tensile stressors may be referred to as contact etch stop layer (ESL) stressors; however, for ease of explanation, they will be referred to as simply compressive and tensile stressors or stressor layers.

The formation of compressive and tensile stressors (or stressor layers) over the P channel and N channel transistors, respectively, results in boundaries or borders between compressive stressors and tensile stressors, as will be described in more detail below. A previously unknown problem regarding etching at these boundaries between compressive and tensile stressors, such as during the formation of contact openings, has been discovered. The formation of the boundaries and the newly discovered problems caused by these boundaries will be described in more detail in reference to FIGS. 1-10. Various embodiments solving this newly discovered problem will then be discussed in reference to FIGS. 11-22.

Figure 1:
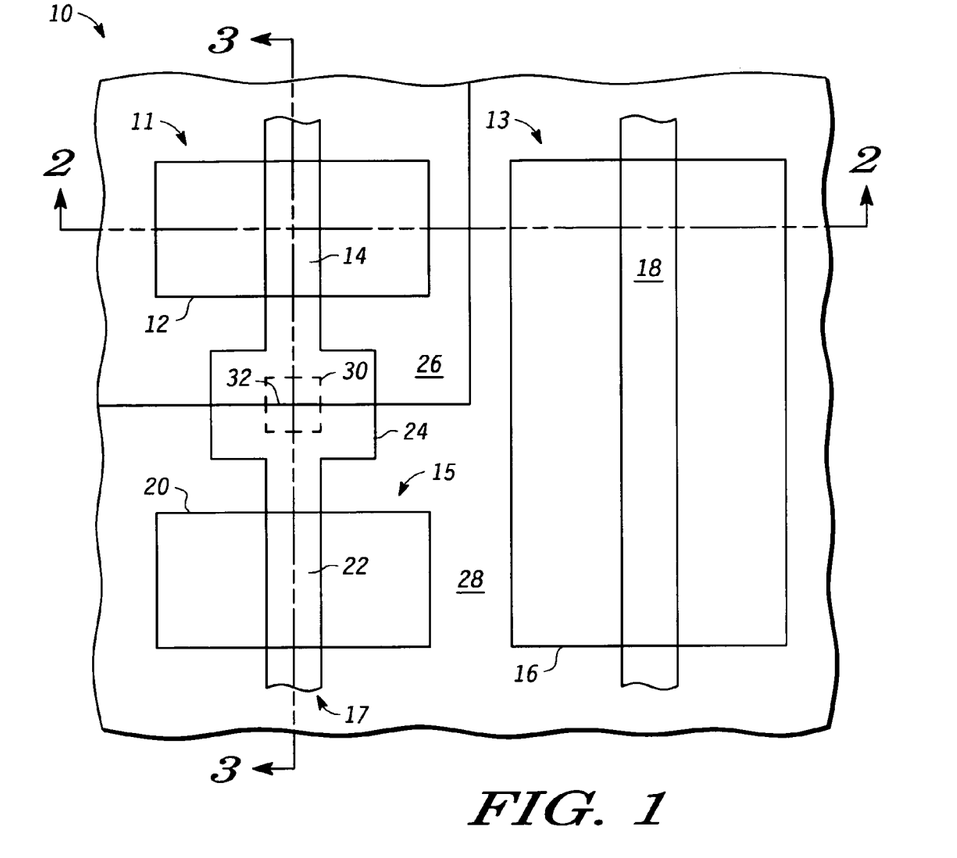
FIG. 1 illustrates a top-down view of a portion of an integrated circuit.

FIG. 1 illustrates a top-down view of a portion of an integrated circuit (IC) 10 having both compressive and tensile stressors. IC 10 includes a P channel transistor 11 and N channel transistors 13 and 15. P channel transistor 11 has an active area 12 and a gate 14 overlying active area 12, and is formed in an N well (not visible in the top-down view of FIG. 1). N channel transistor 15 has an active area 20 and a gate 22 overlying active area 20. In the illustrated embodiment, gate 14 and gate 22 are portions of a continuous gate structure 17. Gate structure 17 also includes portions outside active areas 12 and 20. Gate structure 17 includes a contact portion 24 where a contact opening 30 will subsequently be formed (therefore, contact opening 30 is illustrated as a dotted line since the opening itself does not yet exist). N channel transistor 13 includes an active area 16 and a gate structure 18 overlying active area 16. Note that gate structure 18 forms a gate over active area 16 and also includes portions outside active area 16.

IC 10 also includes a compressive stressor 26 over P channel transistor 11 and a tensile stressor 28 over N channel transistors 13 and 15. Therefore, boundaries are formed between compressive stressor 26 and tensile stressor 28. For example, a boundary 32 exists over contact portion 24, where contact opening 30 will be formed. This boundary, as will be seen in reference to FIGS. 2-10 results in problems during formation of contact opening 30.

Figure 2:
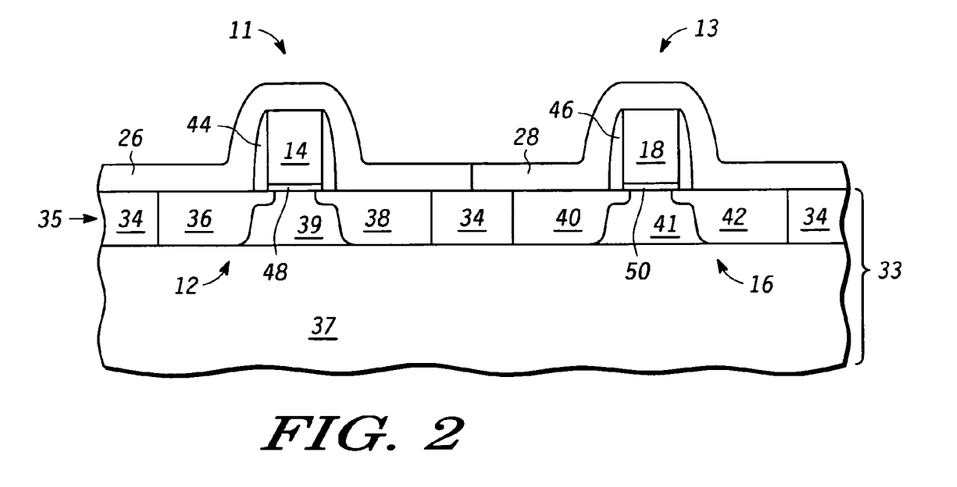
FIG. 2 illustrates a cross-sectional view of the integrated circuit of FIG. 1 taken in a first direction.

FIG. 2 illustrates a cross-sectional view of IC 10 taken through P channel transistor 11 and N channel transistor 13. IC 10 includes a substrate 33 having a semiconductor layer 35 over an insulating layer 37. In one embodiment, substrate 33 is a semiconductor on insulator (SOI) substrate. In one embodiment, semiconductor layer 35 includes a semiconductor material such as, for example, silicon, germanium, silicon germanium, gallium arsenide, or the like. In one embodiment, insulating layer 37 may include oxide. In an alternate embodiment, substrate 33 may be a bulk semiconductor substrate including, for example, silicon, germanium, silicon germanium, gallium arsenide, or the like, where insulating layer 37 would not be present.

Transistors 11 and 13 are formed in and on semiconductor layer 35. P channel transistor 11 includes a gate dielectric 48 overlying semiconductor layer 35, gate 14 overlying gate dielectric 48, and sidewall spacers 44 adjacent sidewalls of gate 14 (note that for the sake of simplicity, sidewall spacers 44 are not illustrated in the top-down view of FIG. 1). Transistor 11 also includes source/drain regions 36 and 38 which underlie at least a portion of gate 14 and extend to insulator layer 37. A channel region 39 of transistor 11 is defined between source/drain regions 36 and 38, under gate 14. Source/drain regions 36 and 38 and channel region 39 are formed in active area 12 of transistor 11. N channel transistor 13 includes a gate dielectric 50 overlying semiconductor layer 35, gate 18 overlying gate dielectric 50, and sidewall spacers 46 adjacent sidewalls of gate 18 (note that for the sake of simplicity, sidewall spacers 46 are not illustrated in the top-down view of FIG. 1). Transistor 13 also includes source/drain regions 40 and 42 which underlie at least a portion of gate 18 and extend to insulator layer 37. A channel region 41 of transistor 13 is defined between source/drain regions 40 and 42, under gate 18. Source/drain regions 40 and 42 and channel region 41 are formed in active area 16 of transistor 13. Transistors 11 and 13 are isolated from each other by isolation region 34 formed in semiconductor layer 35.

Note that conventional processing and materials may be used to form transistors 11 and 13. Also, each of transistors 11 and 13 may have different forms, and FIG. 2 is only meant as one example. For example, source/drain regions 36, 38, 40, and 42 may not fully extend to insulator layer 37, or source/drain region 36, 38, 40, and 42 may include halo regions. Also, each portion of transistors 11 and 13, such as, for example, the gates, spacers, and gate dielectric, may include a single material or combination of materials. For example, the gates of transistors 11 and 13 may be polysilicon or metal gates, and may include any number of layers.

Still referring to FIG. 2, compressive stressor 26 is formed over P channel transistor 11 and tensile stressor 28 is formed over N channel transistor 13. Any process may be used to form stressors 26 and 28. For example, in one embodiment, a compressive stressor layer may be blanket deposited over substrate 33 and selectively etched from those regions having N channel devices formed therein. It can be selectively etched using, for example, a masking layer to mask those regions having P channel devices formed therein. The remaining portions of the compressive stressor layer after the selective etching form compressive stressors, such as compressive stressor 26. Afterwards, a tensile stressor layer may be blanket deposited over substrate 33 and selectively etched from those regions having P channel devices formed therein. It can then be selectively etched using, for example, a masking layer (having, for example, an inverse pattern to the masking layer used to form the compressive stressors) to mask those regions having N channel devices formed therein. The remaining portions of the tensile stressor layer after the selective etching form tensile stressors, such as tensile stressor 28. Note that the order of forming the compressive stressors and tensile stressors may be reversed, or other conventional processing methods may be used to form the compressive stressors and tensile stressors. In one embodiment, an insulating layer may be formed over the first stressor layer that can be etched selectively to the first stressor (where the first stressor layer is compressive stressor 26 in the example provided in this paragraph). This insulating layer may therefore be used as an etch stop layer when selectively etching the second stressor layer (which is tensile stressor 28 in the example provided above in this paragraph). Also, in one embodiment, a barrier layer may be formed over substrate 33 prior to formation of stressors 26 and 28, such that the barrier layer lies between the devices and stressors 26 and 28. Note that the formation of the compressive and tensile stressors results in boundaries at the interfaces between the compressive and tensile stressors, such as boundary 32 between compressive stressor 26 and tensile stressor 28 illustrated in FIG. 2.

Compressive stressor 26 may be any material which applies a compressive stress to channel region 39, such as, for example, silicon-nitride materials and silicon-lean silicon-nitride materials. Tensile stressor 28 may be any material which applies a tensile stress to channel region 41, such as, for example, silicon-nitride materials and silicon-lean silicon nitride materials. These compressive and tensile stressor layers can be formed using conventional processing techniques. In one embodiment, the nitride of compressive stressor 26 is deposited using a dual frequency plasma enhanced chemical vapor deposition (PECVD) process with an inert gas such as argon added to the standard precursors, whereas the nitride of tensile stressor 28 is deposited using a single frequency PECVD process with no inert gas.

Figure 3:
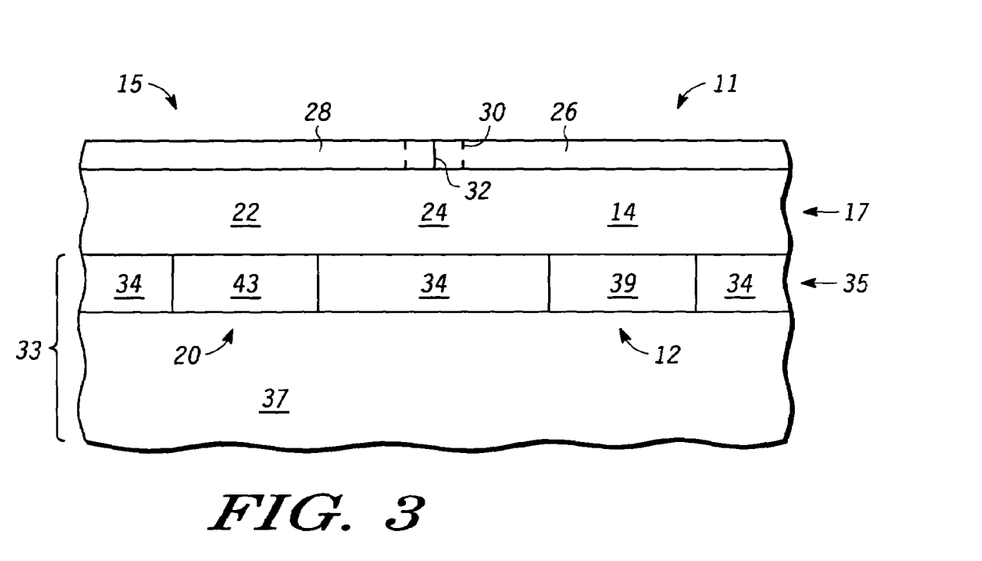
FIGS. 3 and 4 illustrate cross-sectional views of the integrated circuit of FIG. 1 taken in a second direction and showing subsequent processing.

FIG. 3 illustrates a cross-sectional view of IC 10 taken through N channel transistor 15 and P channel transistor 11. The cross section of FIG. 3 is taken through channel region 39 of transistor 11 and through a channel region 43 of transistor 15. As described above, these channel regions are isolated by isolation region 34. The cross section is also taken through gate structure 17 where gates 22 and 14 and contact portion 24 of gate structure 17 are all visible. Also, tensile stressor 28 is overlying gate 22, extending over onto contact portion 24 of gate structure 17. Compressive stressor 26 is overlying gate 14, extending over onto contact portion 24 of gate structure 17. Contact portion 24 overlies isolation region 34 (which may also be referred to as field isolation) and does not overly active areas 20 and 12. Also illustrated in the cross-section of FIG. 3 is boundary 32 between tensile stressor 28 and compressive stressor 26 over contact region 24 and the place where contact opening 30 will be formed. Therefore, note that contact opening 30 will be formed through boundary 32 to expose underlying contact portion 24 of gate structure 17.

Figure 4:
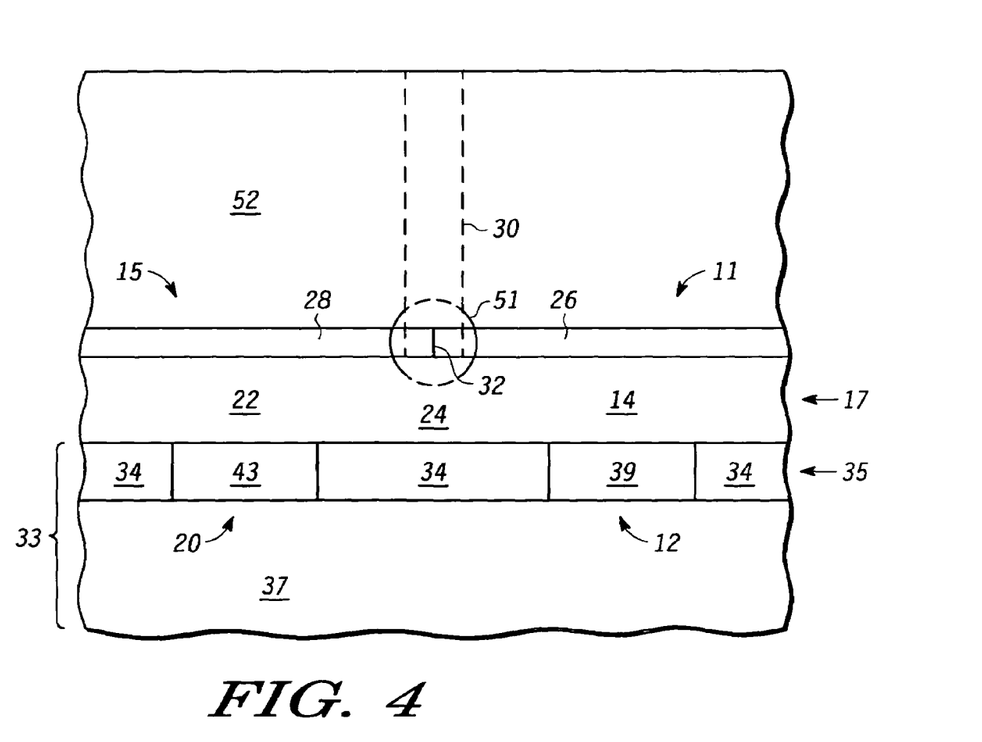

FIG. 4 illustrates IC 10 after formation of a dielectric layer 52 overlying tensile stressor 28 and compressive stressor 26. Note that contact opening 30 will therefore be formed through dielectric layer 52 and stressors 28 and 26, as illustrated by the dotted lines in FIG. 3. In one embodiment, dielectric layer 52 may include materials formed by tetraortho silicate (TEOS) processes.

Figures 5, 7:
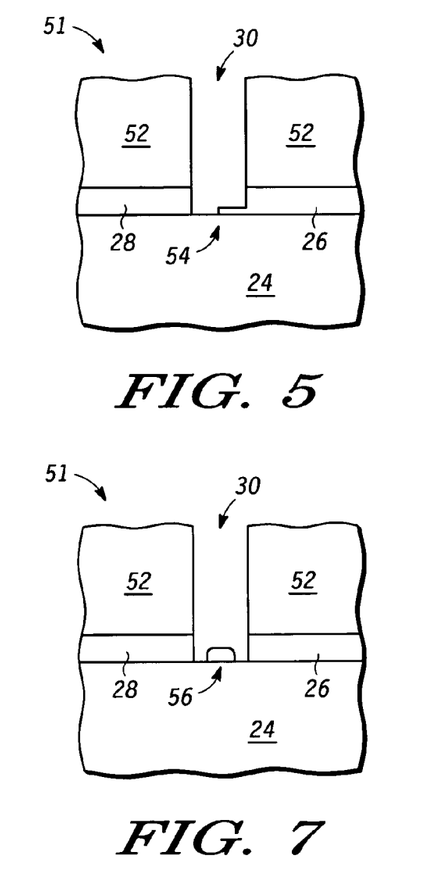
FIGS. 5-10 illustrate a zoomed in view of various different situations and problems which may arise during the formation of a contact opening in the integrated circuit of FIG. 4.

FIG. 5 illustrates a zoomed in portion 51 of IC 10 after the formation of contact opening 30. Conventional patterning and etching techniques may be used to form opening 30. Due to the difference in chemistries between compressive stressor 26 and tensile stressor 28, the stressors have different etch rates. Therefore, in attempting to etch through both compressive stressor 26 and tensile stressor 28 within opening 30, gaps (such as gap 54) are formed and the underlying gate silicide (not shown) in the gaps is gouged or pitted in an attempt to fully expose contact portion 24 within opening 30. That is, in an attempt to remove all portions of one of the stressors (such as stressor 26 in the example of FIG. 5), damage occurs to the underlying layer, which can result in poorer contacts. Furthermore, portions of a stressor may be left within opening 30, which also results in poorer contacts.

Figures 6, 8:
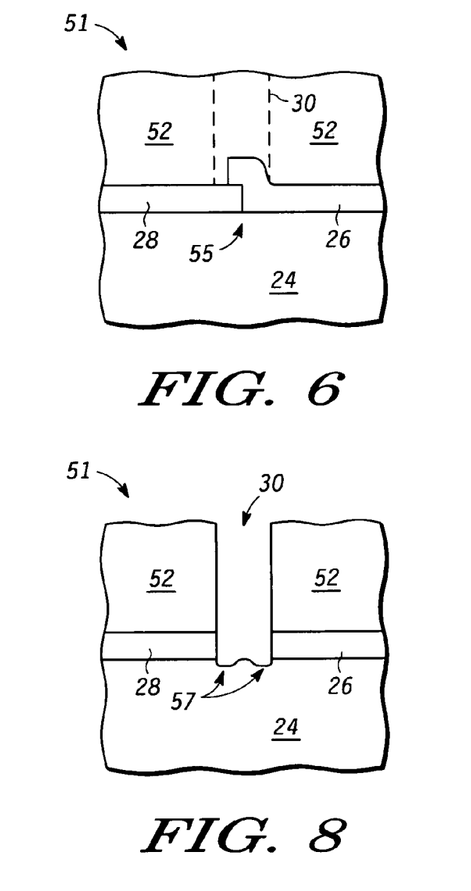

FIG. 5 illustrates the result of etching through boundary 32 when boundary 32 is formed such that compressive and tensile stressors meet as illustrated in FIGS. 2-4. FIG. 6 illustrates another type of boundary 55 between stressors which may occur in zoomed in portion 51 of IC 10 where one stressor may overlap another at the boundaries. For example, as illustrated in FIG. 6, compressive stressor 26 overlaps compressive stressor 28 in the area where contact opening 30 will subsequently be formed.

FIGS. 7 and 8 illustrate the deleterious effects of boundary 55 during the formation of opening 30. As described in reference to FIG. 5, conventional patterning and etching techniques may be used to form opening 30. FIG. 7 illustrates boundary 55 after a portion of the etch has been completed. A residual portion 56 of tensile stressor 28, which was overlapped by compressive stressor 26, is left behind within opening 30. FIG. 8 illustrates boundary 55 after further etching where, as more of residual portion 56 is removed in opening 30, regions of pitting or gouging 57 can be formed. These issues may also result in a poorer contact, thus negatively impacting device performance and circuit yield.

Figure 9:
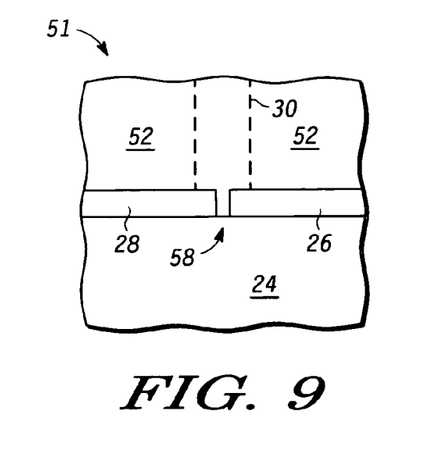
Figure 10:
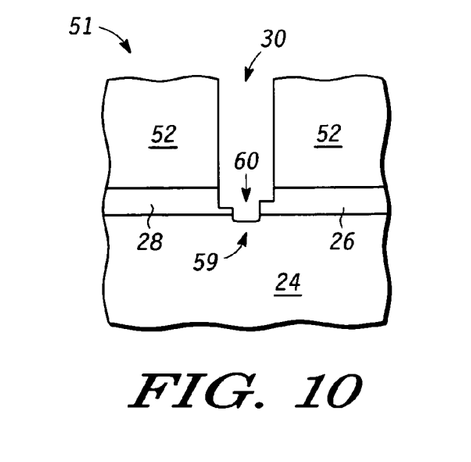

FIG. 9 illustrates another type of boundary 58 between stressors which may occur in zoomed in portion 51 of IC 10 where the formation of stressors 28 and 26 results in a gap 59 at the boundary. FIG. 10 illustrates the negative effects of boundary 58 during formation of opening 30. As described above, conventional patterning and etching techniques may be used to form opening 30. FIG. 10 illustrates uneven etching of stressors 28 and 26, and the formation of a pit 60 (i.e. a recessed surface) into contact portion 24 within gap 58. Therefore, as described above, gap 58 can also lead to gouging or pitting. Also, the uneven etching may result in a partial etch where portions of a stressor may remain in opening 30, resulting in poor contacts.

The problems caused by forming opening 30 through stressor boundaries, such as boundaries 32, 55, and 58 were previously unknown. Furthermore, these problems can occur quite often across an IC. For example, as illustrated in FIG. 1, a contact to a gate is often formed half way between N and P channel transistors which is also the seemingly best location for the border or boundary between compressive and tensile stressors. Therefore, upon the discovery of these problems, a solution was developed to prevent the deleterious effects of etching through these stressor boundaries. Embodiments of the present invention include various ways to address the problems caused by etching through these boundaries.

Figure 11:
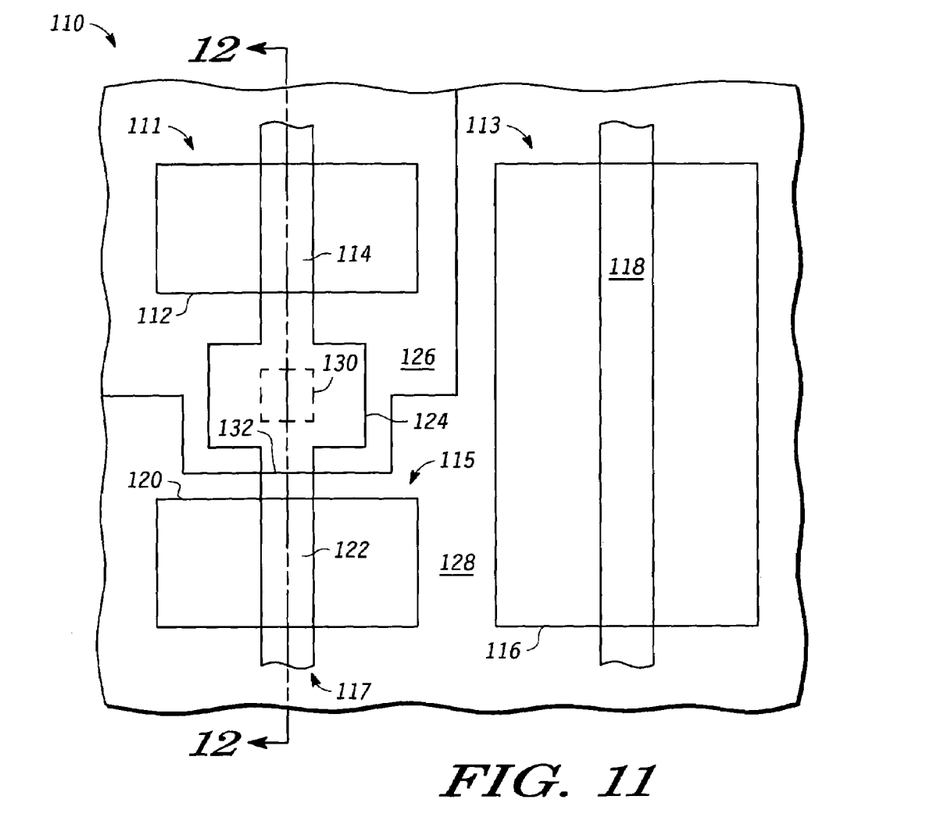
FIG. 11 illustrates a top-down view of a portion of an integrated circuit in accordance with one embodiment of the present invention.

In one embodiment, stressors are formed such that stressor boundaries are not located at or near where contact openings are to be formed. For example, FIG. 11 illustrates a top-down view of an integrated circuit 110 in accordance with one embodiment of the present invention. IC 110 includes a P channel transistor 111 and N channel transistors 113 and 115. P channel transistor 111 has an active area 112 and a gate 114 overlying active area 112, and is formed in an N well (not visible in the top-down view of FIG. 11). N channel transistor 115 has an active area 120 and a gate 122 overlying active area 120. In the illustrated embodiment, gate 114 and gate 122 are portions of a continuous gate structure 117. Gate structure 117 includes portions outside active areas 112 and 120. Gate structure 117 includes a contact portion 124 where a contact opening 130 will subsequently be formed (therefore, contact opening 130 is illustrated as a dotted line since the opening itself does not yet exist). In one embodiment, gate structure 117 is a continuous conductive line of polysilicon. Alternatively, gate structure 117 may not be continuous, and other materials or combination of materials may be used to form gate structure 117. N channel transistor 113 includes an active area 116 and a gate structure 118 overlying active area 116. Note that gate structure 118 forms a gate over active area 116 and also includes portions outside active area 116.

IC 110 also includes a compressive stressor 126 over P channel transistor 111 and a tensile stressor 128 over N channel transistors 113 and 115. Just as in IC 10 of FIG. 1, boundaries are formed between compressive stressor 126 and tensile stressor 128. For example, a boundary 132 exists between active areas 112 and 120. However, unlike in IC 10, no boundary is located under or near where contact opening 130 is to be formed. Instead, compressive stressor 126 is formed such that its boundary with tensile stressor 126 does not occur under a contact portion of a gate structure where a contact opening will be formed. Furthermore, it is formed at least a predetermined distance away from where contact opening will be formed. In one embodiment, this predetermined distance is about 70 nanometers. This allows for a better contact to be formed within contact opening 130, resulting in improved device performance. In another embodiment, this predetermined distance is less than or equal to about 65 nanometers. Note that this predetermined distance can be any value selected based on the combined process tolerances, including photo critical dimension (CD) control, photo overlay control, and etch CD control.

Figure 12:
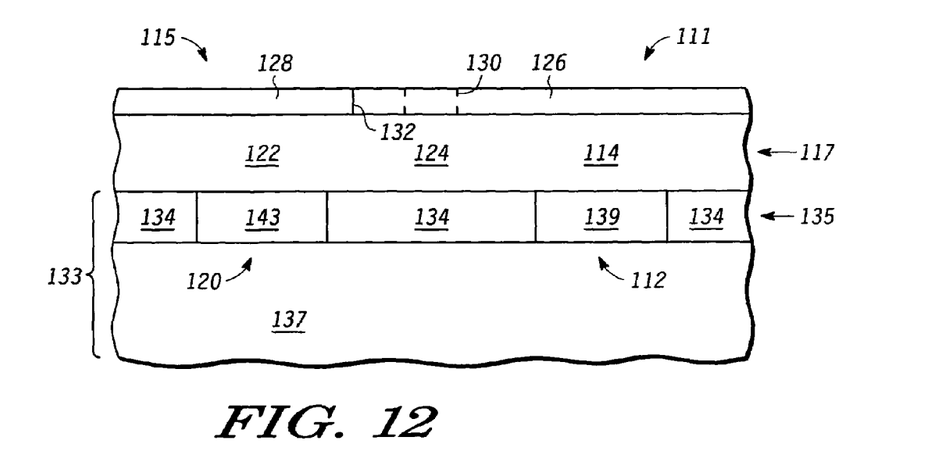
FIGS. 12-15 illustrate a cross-sectional view of the integrated circuit of FIG. 11 during various stages of processing.

FIG. 12 illustrates a cross-sectional view of IC 110 taken through N channel transistor 115 and P channel transistor 111. IC 110 includes a substrate 133 having a semiconductor layer 135 over an insulating layer 137. In one embodiment, substrate 133 is a semiconductor on insulator (SOI) substrate. In one embodiment, semiconductor layer 135 includes a semiconductor material such as, for example, silicon, germanium, silicon germanium, gallium arsenide, or the like. In one embodiment, insulating layer 137 may include oxide. In an alternate embodiment, substrate 133 may be a bulk semiconductor substrate including, for example, silicon, germanium, silicon germanium, gallium arsenide, or the like, where insulating layer 137 would not be present.

The cross section of FIG. 12 is taken through a channel region 143 of transistor 115 and a channel region 139 of transistor 114. These channel regions are isolated by an isolation region 134. The cross section is also taken through gate structure 117 where gates 122 and 114 and contact portion 124 of gate structure 117 are all visible. Also, tensile stressor 128 is overlying gate 122, extending over onto contact portion 124 of gate structure 117. Compressive stressor 126 is overlying gate 114, extending over onto contact portion 124 of gate structure 117. Contact portion 124 overlies isolation region 134 (which may also be referred to as field isolation) and does not overly active areas 120 and 112. Also illustrated in the cross-section of FIG. 12 is boundary 132 between tensile stressor 128 and compressive stressor 126 over contact region 124. However, in the illustrated embodiment, the boundary of compressive stressor 126 has been extended further over contact portion 124 as compared to tensile stressor 128. Therefore, contact opening 30 will not be formed through boundary 132. In one embodiment, boundary 132 is at least 70 nanometers away from opening 130. Therefore, the formation of opening 30 to expose underlying contact portion 24 of gate structure 17 does not require an etch through or within a predetermined distance of a stressor boundary.

The general methods and materials used for forming stressors 26 and 28 described above also apply here to stressors 126 and 128. However, as will be described in reference to the layouts of FIGS. 16-21, new masks are defined to form stressors 126 and 128 such that the problems of having contact openings being over or near boundaries is avoided. These new masks (and inverse of these masks) may be used as described above with respect to stressors 26 and 28 to selectively etch portions of a compressive stressor layer to form compressive stressors 126 and to selectively etch portions of a tensile stressor layer to form tensile stressors 128. Note that in one embodiment, compressive stressor 128 is formed such that it completely covers all P-channel active portions, such as active areas 120 and 116 and tensile stressor 126 is formed such that it completely covers all N-channel active portions, such as active area 112. Therefore, each of compressive stressor 128 and tensile stressor 126 may be a single continuous layer or may include many discrete portions, as needed, to cover the P-channel and N-channel transistors, respectively, as needed.

Compressive stressor 26 may be any material which applies a compressive stress to channel region 39, such as, for example, silicon-nitride materials and silicon-lean silicon-nitride materials. Tensile stressor 28 may be any material which applies a tensile stress to channel region 41, such as, for example, silicon-nitride materials and silicon-lean silicon nitride materials. These compressive and tensile stressor layers can be formed using conventional processing techniques. In one embodiment, the nitride of compressive stressor 26 is deposited using a dual frequency plasma enhanced chemical vapor deposition (PECVD) process with an inert gas such as argon added to the standard precursors, whereas the nitride of tensile stressor 28 is deposited using a single frequency PECVD process with no inert gas.

Still referring to FIG. 12, transistors 111 and 113 are formed in and on semiconductor layer 135. Although not shown in FIG. 12, each of N channel transistor 115 and P channel transistor 111 includes a gate dielectric overlying active areas 143 and 139 of semiconductor layer 135, under gates 122 and 114, respectively. Also, sidewall spacers (not visible in FIG. 12) may be formed adjacent gates 122 and 114. Each of transistors 115 and 111 include source/drain regions in active areas 120 and 112, respectively, which are also not visible in FIG. 12 because the cross-section is taken through the channel regions 143 and 139, located between the source/drain regions of each transistor.

The source/drain regions of transistors 115 and 111 may be formed using conventional processes and materials, and any descriptions provided above with respect to source/drain regions 36, 38, 40, and 42 would also apply to the source/drain regions of transistors 115 and 111.

Note that conventional processing and materials may be used to form transistors 111 and 115. Also, each of transistors 111 and 115 may have different forms, and FIG. 12 is only meant as one example. Also, each portion of transistors 111 and 115, such as, for example, the gates, spacers, and gate dielectric, may include a single material or combination of materials. For example, the gates of transistors 111 and 115 may be polysilicon or metal gates, and may include any number of layers.

Figure 13:
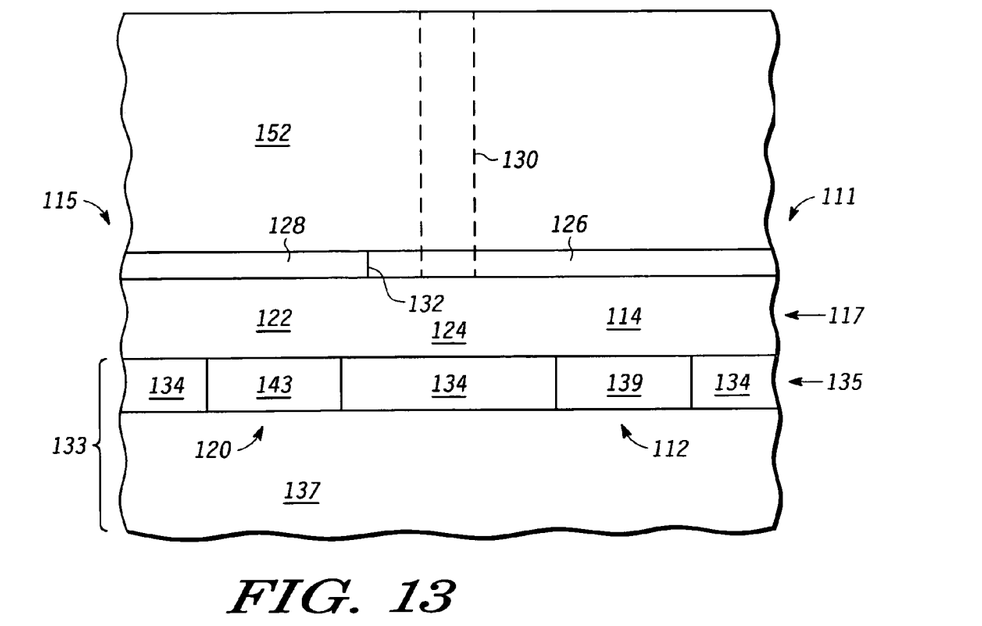

FIG. 13 illustrates IC 110 after formation of a dielectric layer 152 overlying tensile stressor 128 and compressive stressor 126. Note that contact opening 130 will therefore be formed through dielectric layer 152 and stressors 128 and 126, as illustrated by the dotted lines in FIG. 13. In one embodiment, dielectric layer 152 may include materials formed by tetraorthosilicate (TEOS) processes. Also, dielectric layer 152 may include a single film or multiple films. Dielectric layer 152 may also be referred to as an interlayer dielectric layer or an intermetal dielectric layer.

Figure 14:
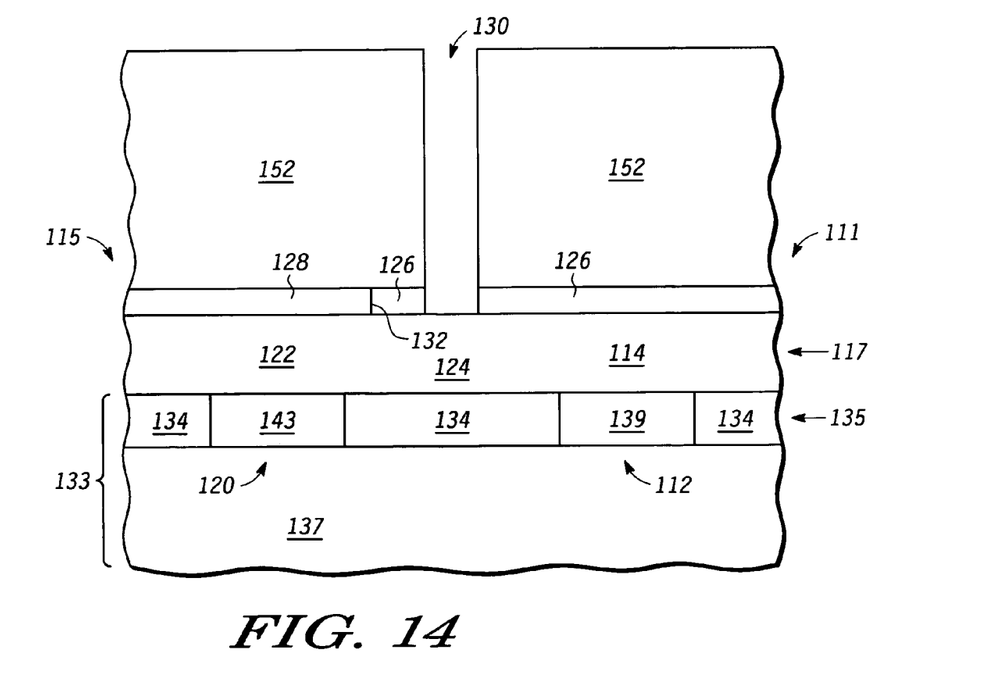

FIG. 14 illustrates IC 110 after formation of contact opening 130. Using conventional masking, patterning, and etching techniques, contact opening 130 is formed through dielectric layer 152 and compressive stressor 126 to expose underlying contact portion 124 of gate structure 117. Note that since the boundary 132 between tensile stressor 128 and compressive stressor 132 is located spaced apart from contact opening 130, etching through boundary 132 is not necessary in forming contact opening 130. Therefore, the problems associated with boundary 32 described above in reference to FIGS. 4-10 are not present in the embodiment of FIG. 14. Therefore, by spacing boundaries between stressors (e.g. between tensile and compressive stressors) a predetermined distance away from locations where openings will be formed, improved openings (such as improved contact opening 130) can be formed, resulting in an improved contact, and thus, an improved device.

Although compressive stressor 126 is formed such that contact opening 130 is formed entirely through compressive stressor 126, in an alternate embodiment, tensile stressor 128 can be further extended over contact potion 124 of gate structure 117 such that boundary 132 would be located spaced apart and to the right of contact opening 130 in the cross section of FIG. 14. In this embodiment, contact opening would be formed through tensile stressor 128 to expose underlying contact portion 24 of gate structure 117 rather than through compressive stressor 126. Therefore, so long as contact opening 130 is spaced apart from boundary 132 (which can be achieved in many different ways), the formation of contact opening 130 requires the etching through a single stressor layer (i.e. only compressive stressor 126 or only tensile stressor 128), thus avoiding the problems described above in reference to FIGS. 4-10.

Figure 15:
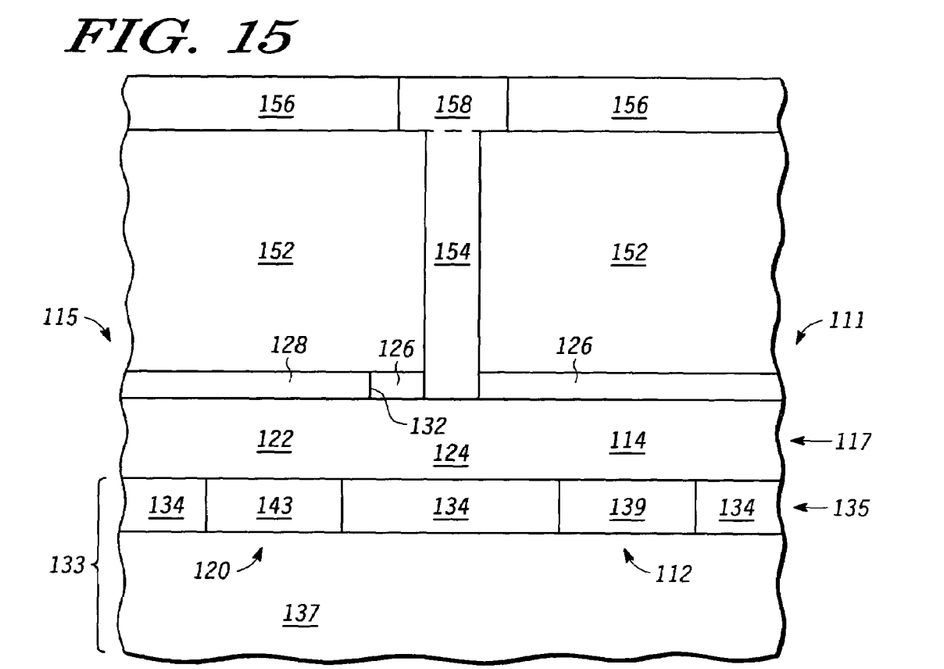

FIG. 15 illustrates IC 110 where contact opening 130 is filled with a conductive material 154. Conventional filling and chemical mechanical polishing (CMP) techniques may be used to fill contact opening 130 with conductive material 154. IC 110 also includes a dielectric layer 156 overlying dielectric layer 152. Dielectric layer 156 includes a conductive portion 158 contacting conductive material 154. Therefore, a contact is formed to contact portion 124 of gate structure 117. In one embodiment, conductive material 154 includes, for example, tungsten, and conductive portion 158 includes, for example, copper. Note that the conductive material used for conductive portion 158 may differ from conductive material 154. In one embodiment, at least one barrier layer (or other type of layer) may be included between conductive material 154 and conductive portion 158. Processing may then continue, as known in the art, to form any number of metal and via layers overlying dielectric layer 156 and conductive portion 158 to route signals between devices of IC 110 and to input/output (I/O) bond pads of IC 110.

Figure 16:
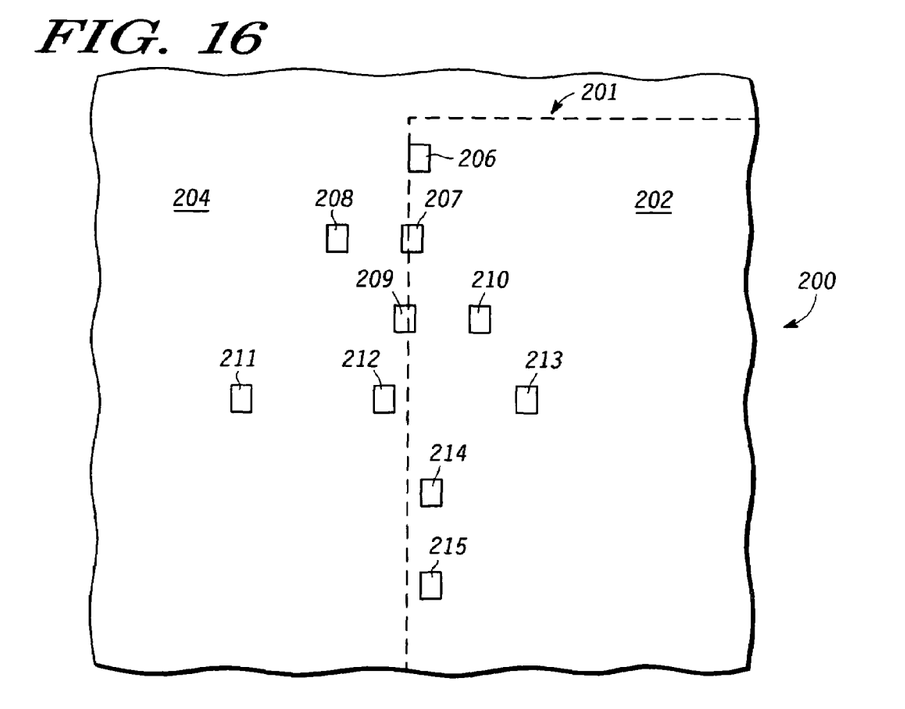
FIGS. 16-21 illustrate layouts of an integrated circuit at various stages of creating a layout for the integrated circuit, in accordance with an embodiment of the present invention.

FIG. 16 illustrates a top down view of an IC layout 200 in accordance with one embodiment of the present invention. IC layout 200 can then be used, as known in the art, to form an IC, such as, for example, ICs 10 and 110. For example, the layers of layout 200 may be used to form different masks which will be used to form an IC. Layout 200 includes a P-channel region 202 corresponding to where P-channel transistors will be formed and an N-channel region 204 corresponding to where N-channel transistors will be formed. In the illustrated embodiment, regions 202 and 204 are separated by a boundary 201, represented by a dotted line. In one embodiment, boundary 201 may represent the boundary of an N-well where boundary 201 represents the outline of the N-well for region 202. Alternatively, boundary 201 may represent the boundary of a P-type diffusion, wherein boundary 201 represents the outline of the P-type diffusion for region 202. Therefore, note that either the N-well boundary or the P-type diffusion boundary of layout 200 can be used to indicate boundaries between N-type and P-type regions (between regions which correspond to the formation of N-channel transistors and the formation of P-channel transistors, respectively). Alternatively, other layout features may be used to provide boundary 201.

In one embodiment, boundary 201 (whether it indicates the outline of an N-well region or a P-type diffusion region, or the outline of any other layer or layers used to define the boundary) represents the place where, in the integrated circuit corresponding to layout 200, a boundary will be formed between compressive and tensile stressors, such as boundaries 32 or 132 above. For example, in one embodiment, layout 200 is used to form a first mask using boundary 201 which will be used to form a compressive stressor in the P-channel regions. This first mask would protect the P-type regions (such as region 202, defined by boundary 201), and expose all N-type regions. As was described above in reference to the formation of compressive stressors 28 and 128 and tensile stressors 26 and 126, a compressive stressor layer may be formed over the IC substrate (such as over gate structures 17 or 117) where the first mask would then be used to remove portions of the compressive stressor layer formed over the N-channel regions of the IC. Similarly, layout 200 is used to form a second mask using boundary 201 which will be used to form a tensile stressor in the N-channel regions. This second mask can be the inverse of the first mask, where the second mask would protect the N-type regions (such as region 204) and expose all P-type regions (such as region 202, defined by boundary 201). Therefore, a tensile stressor layer may be formed over the IC substrate (such as over gate structures 17 or 117) where the second mask would then be used to remove portions of the tensile stressor layer formed over the P-channel regions of the IC. (Note that in alternate embodiments, the second mask may be used to first form the tensile stressors and the first mask may then be used to form the compressive stressors.) Therefore, it can be understood how boundary 201 of layout 200 may be used to form masks to form ICs having tensile and compressive stressors for N-channel transistors and P-channel transistors, respectively.

However, as described above in reference to FIGS. 4-10, problems may arise at the boundaries of the stressors (where these boundaries correspond to the boundaries of layout 200 which were used to generate the masks used to form the stressors, such as boundary 201). Layout 200 also includes a plurality of contact openings 206-215 which represent where contacts will be formed with respect to layout 200. Those contact openings which are located overlapping boundary 201, immediately adjacent boundary 201, or within a predetermined distance of boundary 201 may be negatively affected by the stressor boundary that would be formed using boundary 201. For example, in the illustrated embodiment, contact openings 206, 207, 209, 212, 214, and 215 may be some of the contact openings that would be affected. Therefore, as will be described in reference to FIGS. 17-21, boundary 201 is modified such that no or substantially no contact opening is affected by a stressor boundary. It is then this modified boundary that is used to create the first and second masks, as described above, used in forming the compressive and tensile stressors. Therefore, in the resulting layout, after modifications, substantially all contact openings will be located at least a predetermined distance (e.g. 70 nanometers) from any stressor boundary. Note that in the illustrated embodiments of layout 200, the contact openings, such as contact openings 206, 207, 209, 212, 214, and 215, are illustrated as rectangles. However, in alternate embodiments they can be any other shape, such as, for example, squares.

Figure 17:
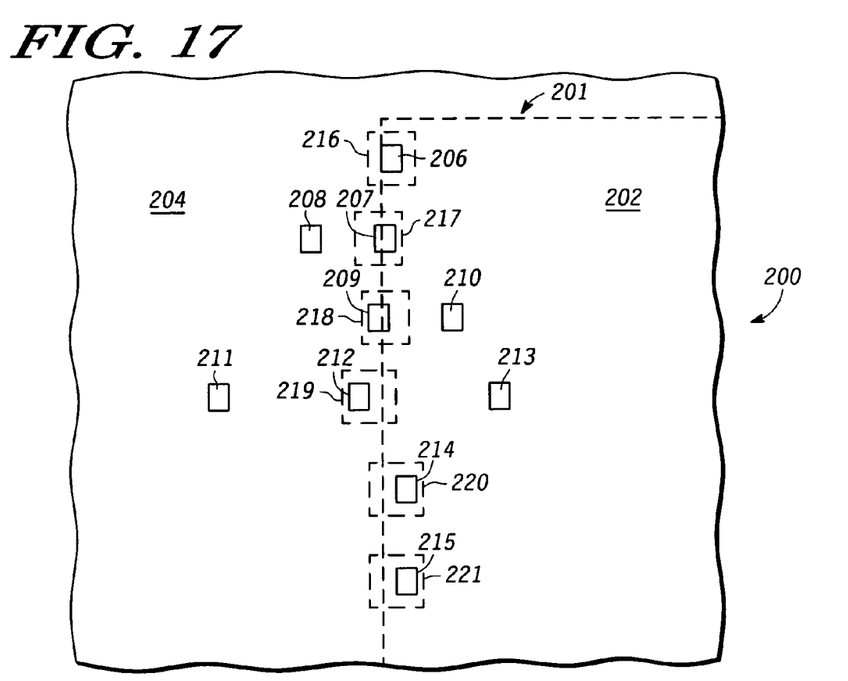

FIGS. 17-21 illustrate various iterations which may be taken to modify boundary 201. These iterations may be performed by, for example, software running on a computer system that is used to generate layouts. In the illustrated embodiment, as described above, the starting boundary (boundary 201) may correspond to either the N-well boundary or the P-type diffusion boundary, or any other layer or layers used to define the boundary. FIG. 17 illustrates a first iteration in which each contact opening lying on or within a predetermined distance of boundary 201 is enlarged. Therefore, contact openings 206, 217, 209, 212, 214, and 215 are all enlarged, resulting in enlarged contact openings 216-221, respectively. In one embodiment, all contact openings within about 70 nanometers of boundary 201 are enlarged. Also, in one embodiment, the contact openings are enlarged by about 70 nanometers. Alternatively, all contact openings within a range of about 60 to 80 nanometers are enlarged by about 60 to 80 nanometers.

Figure 18:
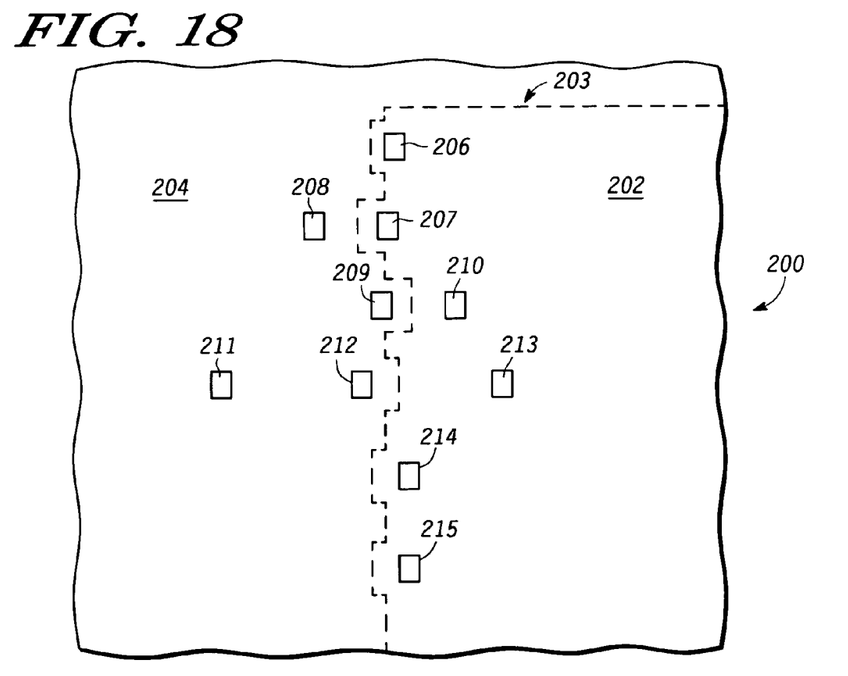

FIG. 18 illustrates a new boundary 203 that is defined using the starting boundary 201 and the boundaries of enlarged contact openings 216-221. Therefore, note that none of contact openings 206-215 actually lie or overlap original boundary 201. Furthermore, depending in which region (region 204 or 202) that a majority of the contact opening lies in, the boundary is taken such that the contact opening remains in that region. For example, the majority of contact openings 206 and 207 lie in region 202, therefore, boundary 203 is routed to the left of openings 206 and 207 in order to allow openings 206 and 207 to remain in region 202. Similarly, boundary 203 is routed to the right of openings 209 and 212 to allow them to remain in region 204. However, alternate embodiments may route boundary 203 differently. For example, in another embodiment, an alternate approach may be utilized wherein a majority of the contacts that are at or within a predetermined distance of the boundary have the boundary moved in a direction to allow the contacts to be over the stressor film for which the contact etch process is more optimal.

Figure 19:
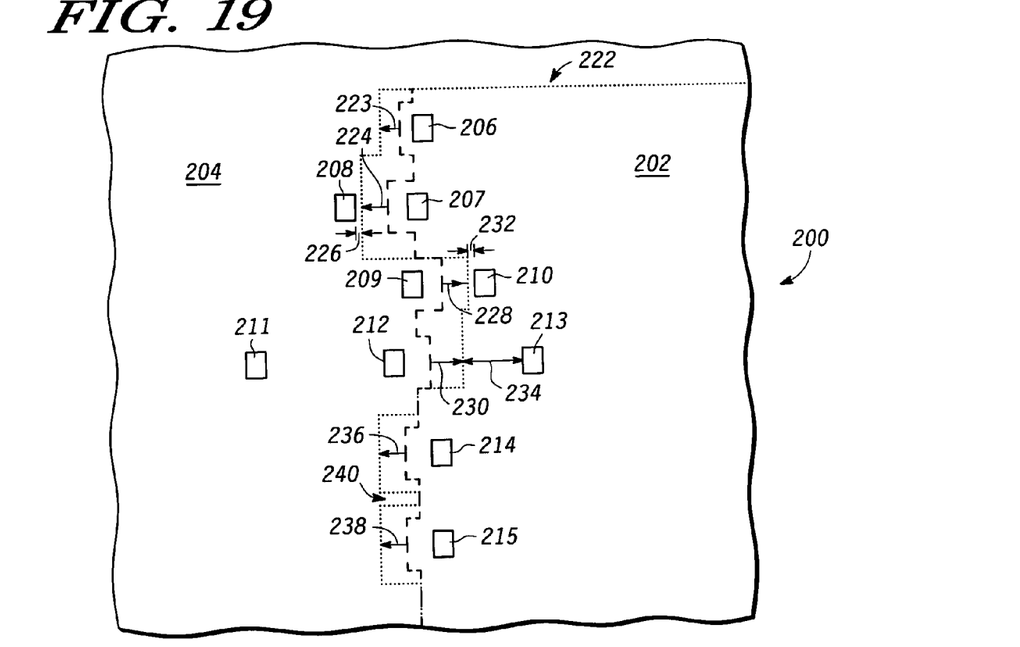

FIG. 19 illustrates layout 200 after modifying boundary 203 to create new boundary 222. In this iteration, the boundaries within a predetermined distance of a contact opening are further extended (in a same direction it was originally modified). For example, note that boundary 222 is extended a distance 223 further left from opening 206, a distance 224 further left from opening 207, a distance 228 further right from opening 209, a distance 230 further right from opening 212, a distance 236 further left from opening 214, and a distance 238 further left from opening 215. Therefore, portions of boundary 203 (illustrated as a dashed line in FIG. 19) is modified, resulting in boundary 222 (illustrated as a small dotted line in FIG. 19). In some embodiments, the boundary is extended by a maximum of about 60 to 80 nanometers.

However, after this iteration, it is determined whether any of these extensions would result in the boundary being too close to other openings or other active circuitry. For example, in FIG. 19, distance 226 between opening 208 and boundary 222 and distance 232 between opening 210 and boundary 222 are too close. For example, they may be within a range of approximately 60-80 nanometers. Therefore, these boundaries may then be retracted so that they are not too close to these other openings or active circuitry.

Figure 20:
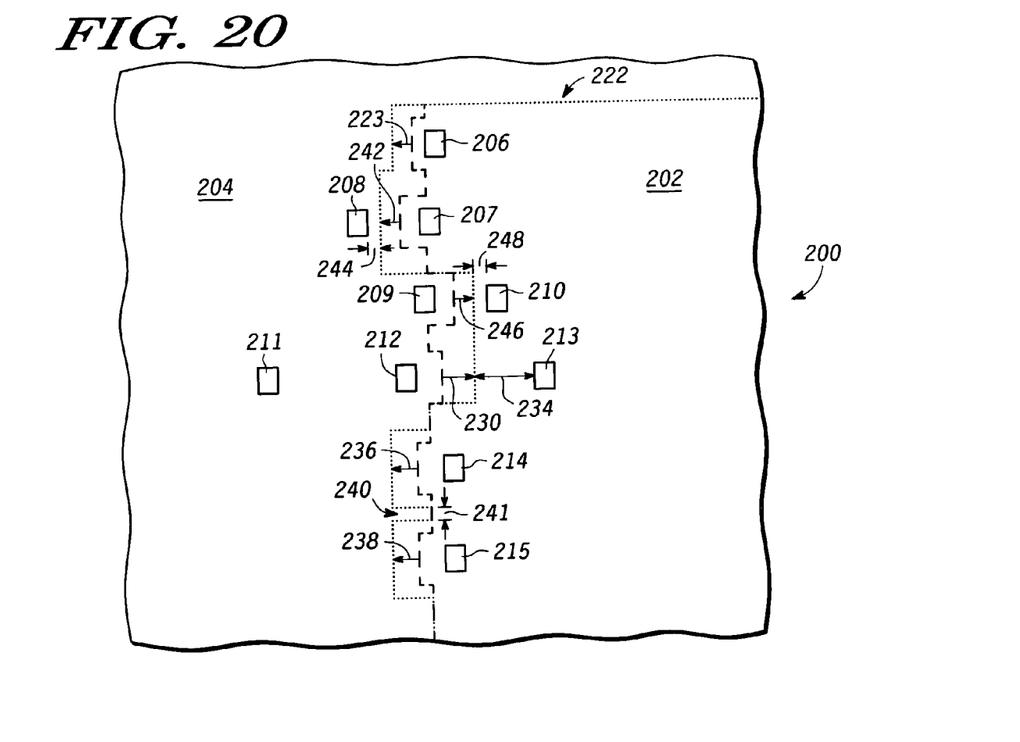

Therefore, as seen in FIG. 20, boundary 222 has been modified such that distance 244 between opening 208 and boundary 222 is greater than distance 226 of FIG. 19. Similarly, distance 248 between opening 210 and boundary 222 is greater than distance 232 of FIG. 19. Now there is sufficient distance between boundary 222 and openings 208 and 210 so that they will not be negatively affected by the stressor boundary. Also, note that after the retraction of the boundary from opening 210, boundary 222 results in a straight edge extending from between openings 209 and 210 down to between openings 212 and 213. This, as will be discussed further below, helps create simpler masks. However, in alternate embodiments, many different types of criteria may be used to modify boundaries to protect from the problems of stressor boundaries while not overly complicating the mask designs.

After any distances are retracted, another inspection of layout 200 may be made to determine if there are any notches or tabs which may be simplified into straighter lines. This can help, for example, create simpler mask designs. For example, referring to FIG. 20, note that the extensions of the boundaries further left of openings 214 and 215 results in a small notch 240 between the extensions of openings 214 and 215. If notch 240 is small enough (having a width 241 of less than about 180 to 280 nanometers in different embodiments), and there are no other openings or features within the notch, then it can be eliminated, as illustrated, for example, in FIG. 21.

Figure 21:
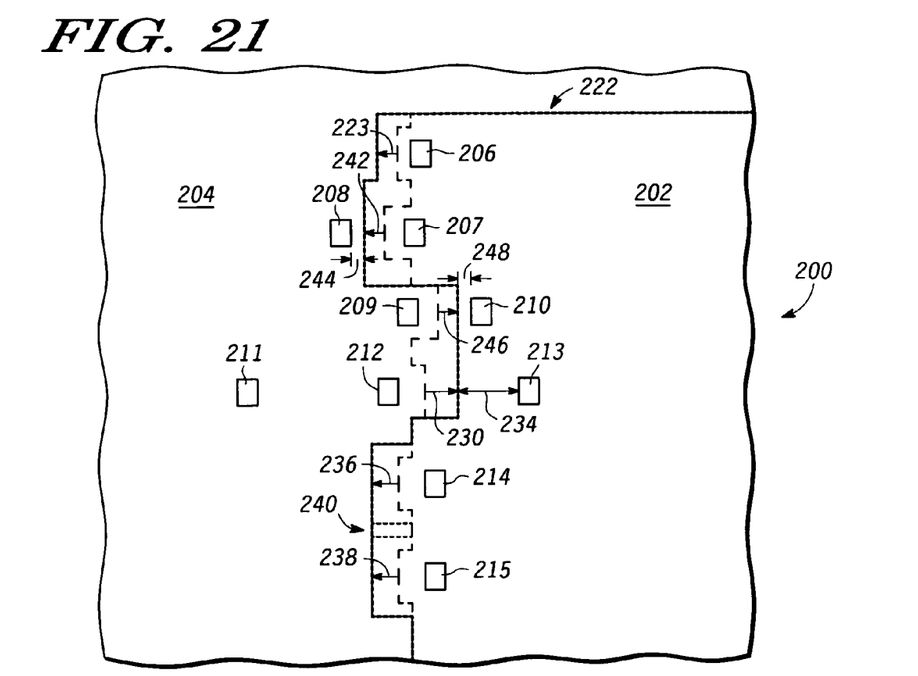

Similarly (but not illustrated in FIG. 21), if a tab is created between openings (such as if the edges of boundary 222 were instead extended to the right of openings 214 and 215 where a tab would extend out to the left between openings 214 and 214, the tab could be identified and similarly eliminated. Therefore, the bolded dashed line of FIG. 21 illustrates one example of the final boundary 222 which can be used to create the compressive and tensile stressors as described above. For example, this final boundary 222 may be used to form the first and second masks described above to form the compressive and tensile stressors.

Note that in alternate embodiments, many more iterations may be made to further simplify layout 200 and boundary 222 or to take into consideration other features. Furthermore, additional iterations of extending boundaries, retracting boundaries, eliminating gaps and tabs, creating straighter boundary edges, or any combination thereof may also be taken, as needed. The resulting boundary of layout 200 can then be used to form the compressive and tensile stressors of an IC manufactured according to layout 200 using, for example, conventional processing techniques. Also, note that in one embodiment, commercial Engineering Design Automation (EDA) tools may be used to perform the mask generation algorithm described with respect to FIGS. 17 to 21.

Figure 22:
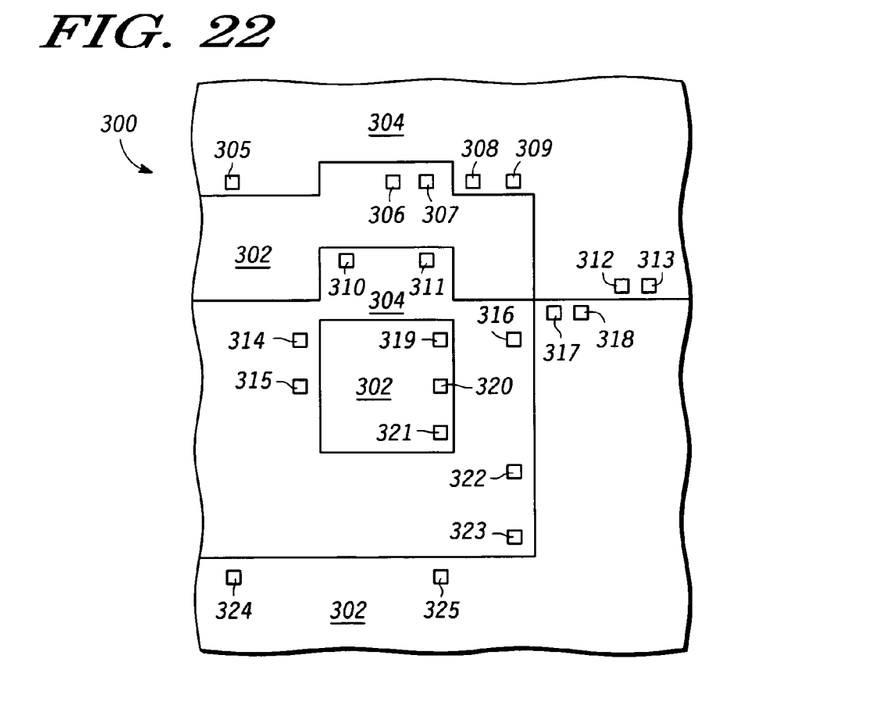
FIG. 22 illustrates a top-down view of an integrated circuit in accordance with one embodiment of the present invention.

FIG. 22 illustrates an example of a top-down view of an IC 300 in which substantially all contacts are located a predetermined distance from any stressor boundary. For example, in the illustrated embodiment, IC 300 includes stressors 302 and 304 where, for example, stressor 302 may be one of a tensile or compressive stressor and stressor 304 may be the other of a tensile or compressive stressor. Therefore, many boundaries between stressors are formed. However, all of contacts 305-325 are formed such that they are spaced apart from the boundaries. In one embodiment, all contacts 305-325 are located at least 70 nanometers away from a stressor boundary. Note that modifying the layout as was described in reference to FIGS. 16-21, is just one example of how to ensure the contact openings do not occur at stressor boundaries. Alternatively, other methods of modifying the layout or of placing contact openings or contacts, or of creating the stressors may be used to ensure that substantially all contacts of an IC are spaced at least a predetermined distance from any stressor boundary. Note that, in one embodiment, substantially all contacts of an IC refers to at least 95 percent of the contacts, or, more preferably, at least 99 percent of the contacts. Also, in the illustrated embodiment, the contacts, such as contacts 305-325, are illustrated as squares, but in alternate embodiments, they can be of any shape.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Moreover, the terms "front", "back", "top", "bottom", "over", "under", "right", "left" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one.

The term "plurality", as used herein, is defined as two or more than two. The term another, as used herein, is defined as at least a second or more.

The term "coupled", as used herein, is defined as connected, although not necessarily directly, and not necessarily mechanically.

What is claimed is:

1. An integrated circuit, comprising:
    a plurality of N channel transistors comprising features formed in first active portions of a semiconductor layer and first gate structures overlying the semiconductor layer, wherein the first gate structures have portions outside the first active portions;
    a plurality of P channel transistors comprising features formed in second active portions of the semiconductor layer and second gate structures overlying the semiconductor layer wherein the second gate structures have portions outside the second active region;
    compressive stressors over the P channel transistors and having portions outside the second active regions;
    tensile stressors over the N channel transistors and having portions outside the first active portions, whereby boundaries are present at interfaces between the tensile and compressive stressors; and
    contacts to the first and second gate structures wherein each contact extends through a compressive stressor or a tensile stressor, and wherein substantially all of the contacts to the first and second gate structures of the integrated circuit are at least a predetermined distance from the boundaries.

2. The integrated circuit of claim 1, wherein at least 95 percent of the contacts of the integrated circuit are at least the predetermined distance from the boundaries.

3. The integrated circuit of claim 2, wherein at least 99 percent of the contacts of the integrated circuit are at least the predetermined distance from the boundaries.

4. The integrated circuit of claim 3, wherein all of the contacts of the integrated circuit are at least the predetermined distance from the boundaries.

5. The integrated circuit of claim 1, wherein the compressive and tensile stressors comprise silicon nitride.

6. The integrated circuit of claim 1, wherein the boundaries are at a location selected from a group consisting of (1) the location where the tensile and compressive stressors have edges that are adjoining, (2) the location where the tensile and compressive stressors have edges that overlap, and (3) the location where the tensile and compressive stressors have edges that have a space between them.

7. The integrated circuit of claim 1, wherein:
the compressive and tensile stressors comprise silicon nitride with relatively small concentrations of hydrogen; and
the nitride of the compressive stressors is deposited using dual frequency PECVD with an inert process gas, and the nitride of the tensile stressors is deposited using single frequency PECVD without an inert process gas.

8. The integrated circuit of claim 7, wherein the compressive stressors completely cover the second active portions and the tensile stressors completely cover the first active portions.

9. The integrated circuit of claim 8, wherein a first plurality of the first and second gate structures comprise continuous conductive lines of polysilicon.

10. The integrated circuit of claim 9, wherein the predetermined distance is 70 nanometers.

11. An integrated circuit, comprising:
a plurality of P channel transistors having a compressive stressors over them, wherein the compressive stressors have portions outside the P channel transistors;
a plurality of N channel transistors having a tensile stressors over them, wherein the tensile stressors have portions outside the N channel transistors;
first contacts through the tensile stressors but outside active areas of the N channel transistors that make electrical contacts to gates of the N channel transistors, wherein substantially all of the first contacts of the integrated circuit are at least 70 nanometers from any portion of the compressive stressors; and
second contacts through the compressive stressors but outside active areas of the P channel transistors that make electrical contact to gates of the P channel transistors, wherein substantially all of the second contacts of the integrated circuit are at least 70 nanometers from any portion of the tensile stressors.

12. The integrated circuit of claim 11, wherein:
the tensile stressors comprises a first nitride layer;
the compressive stressors comprises a second nitride layer;
at least 99 percent of the first contacts of the integrated circuit are at least 70 nanometers from any portion of the compressive stressors; and
at least 99 percent of the second contacts of the integrated circuit are at least 70 nanometers from any portion of the tensile stressors.

* * * * *